United States Patent [19]

Boyette, Jr. et al.

[11] Patent Number: 5,467,020
[45] Date of Patent: Nov. 14, 1995

[54] TESTING FIXTURE AND METHOD FOR CIRCUIT TRACES ON A FLEXIBLE SUBSTRATE

[75] Inventors: James E. Boyette, Jr., Delray Beach; James C. Mahlbacher, Lake Worth, both of Fla.

[73] Assignee: International Business Machines Corporation, Armonk, N.Y.

[21] Appl. No.: 219,610

[22] Filed: Mar. 29, 1994

[51] Int. Cl.⁶ .................................................. G01R 31/02
[52] U.S. Cl. ........................ 324/537; 324/754; 324/690
[58] Field of Search .................................. 324/754, 537, 324/522, 690, 662, 663, 761

[56] References Cited

U.S. PATENT DOCUMENTS

| | | | |
|---|---|---|---|
| 3,009,101 | 11/1961 | Locher | 324/690 |
| 4,155,173 | 5/1979 | Sprandel | 33/174 L |
| 4,786,867 | 11/1988 | Yamatsu | 324/158 F |
| 4,934,064 | 6/1990 | Yamaguchi et al. | 33/645 |
| 4,943,767 | 7/1990 | Yokota | 324/158 F |
| 4,987,365 | 1/1991 | Shreeve et al. | 324/158 F |
| 5,138,266 | 8/1991 | Stearns | 324/537 |
| 5,189,363 | 2/1993 | Bregman et al. | 324/158 F |
| 5,237,268 | 8/1993 | Honma et al. | 324/158 P |

FOREIGN PATENT DOCUMENTS

| | | | |
|---|---|---|---|
| 89005088 | 6/1989 | European Pat. Off. | 324/754 |
| 0343021 | 11/1989 | European Pat. Off. | 324/754 |
| 1012532 | 8/1991 | European Pat. Off. | 324/754 |

Primary Examiner—Maura K. Regan
Attorney, Agent, or Firm—Anthony N. Nagistrale; Ronald V. Davidge; Richard A. Tomlin

[57] ABSTRACT

A mechanism is provided for testing circuit traces extending along a flexible substrate, which is fed in a longitudinal direction between an upper plate and a lower plate. The upper plate includes a number of upper apertures extending across the flexible substrate and a number of upper segments, also extending across the flexible substrate, between adjacent apertures. The lower plate includes lower segments extending under the upper apertures and lower apertures extending under the upper segments. Two upper test probes are moved above the flexible substrate, while two lower test probes are moved under the flexible substrate. Tests are applied to both sides of the flexible substrate as the probes are brought into contact with test points in the areas accessible through the upper and lower apertures, with segments extending along the apertures on the opposite sides of the flexible substrate providing a backing surface for probe contact. A two-probe method may be used to determine the electrical characteristics of a circuit trace extending between test points, or a single-probe method may be used to determine the capacitance between a circuit trace and the plates. Circuit areas on the substrate are moved between the plates in a series of incremental motions to expose various points through the apertures as required to complete the testing process.

21 Claims, 6 Drawing Sheets

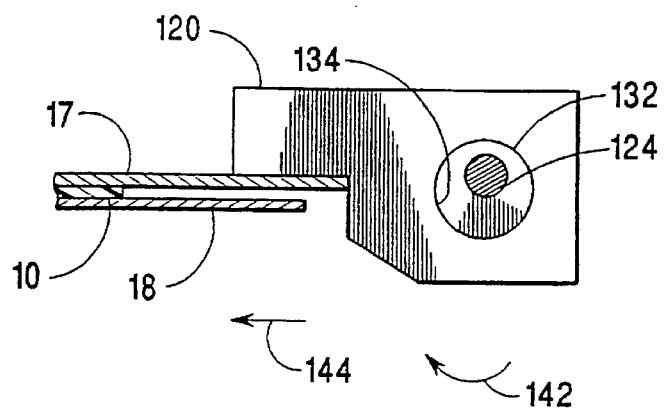
Fig. 9.
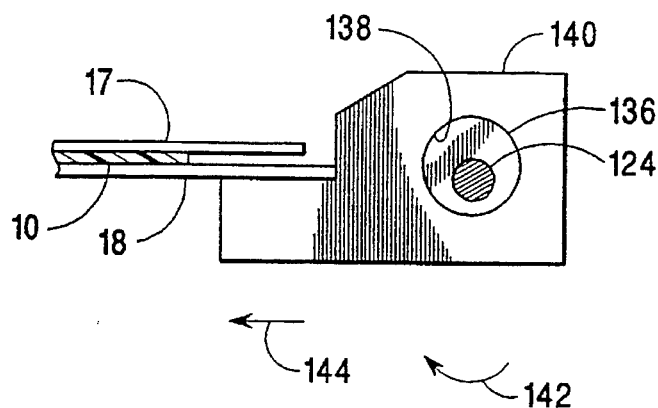
Fig. 10.
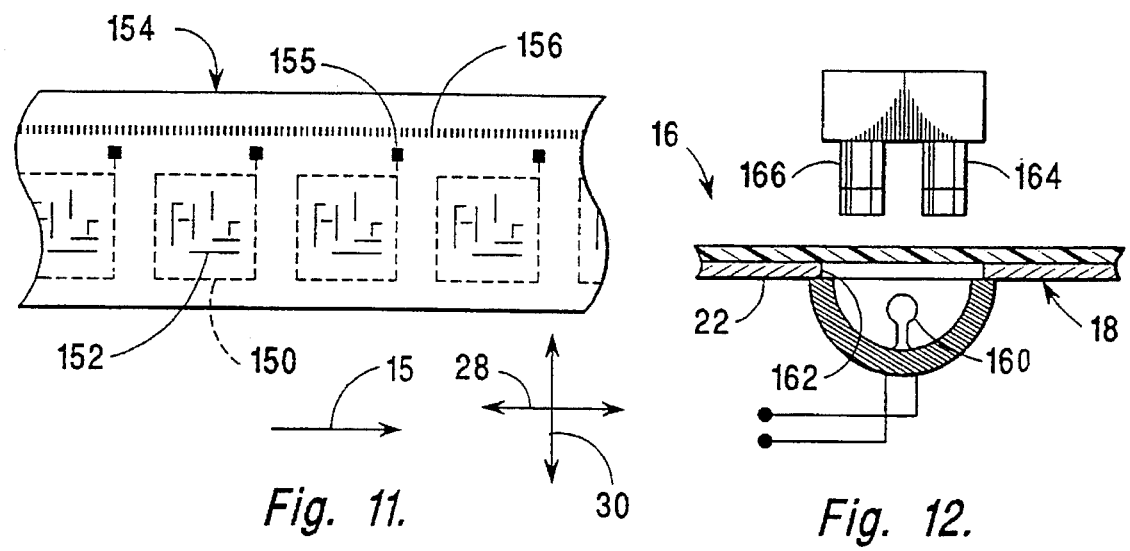
Fig. 11.
Fig. 12.

TESTING FIXTURE AND METHOD FOR CIRCUIT TRACES ON A FLEXIBLE SUBSTRATE

CROSS REFERENCE TO A RELATED APPLICATION

A co-pending U.S. application Ser. No. 08/176,810, filed Jan. 3, 1994, entitled "Open Frame Gantry Probing System," by James Edward Boyette, et al., having a common assignee with the present invention, the disclosure of which is hereby incorporated by reference, describes a system for moving two test probes along each side of a printed circuit being tested, and for moving the probes into engagement with the adjacent surface of the circuit when the probes are brought to the desired locations. Each of the four probes can be moved in both (X and Y) directions perpendicular to one another but parallel to the adjacent surface of the printed circuit.

BACKGROUND OF THE INVENTION

Field of the Invention

This invention relates to testing printed circuits, and more particularly, to testing circuits extending along both sides of a flexible substrate for shorts and open conditions.

Background Information

Test processes used for printed circuit boards include a two-probe method, in which probes are simultaneously placed at two points, or nodes, on a circuit board to measure the electrical characteristics, such as resistance and continuity, of the portion of the circuit extending between these points, and a single-probe method, in which a probe is placed at a single point on the circuit board to measure the capacitance between a portion of the circuit extending from this point and a conductive surface separated from the circuit by dielectric material. This conductive surface may be a part of a circuit board being tested, such as a ground or voltage plane in a multi-layer circuit board, or it may be a conductive surface to which the circuit is held during the test process.

Circuit board testing is typically concerned with detecting the presence of electrical "shorts" or "opens." A short occurs when two adjacent circuits, which should be separated, are inadvertently electrically connected instead. An open occurs when there is a break in a circuit line extending between two points which should be electrically connected. Both the two-probe method and the single-probe method can be used to locate both shorts and opens. However, while the two-probe method is adept at finding opens by simultaneously probing the two points which should connected, the use of this method to find shorts is particularly complex and time consuming. With this method, while a first probe is held on a first point, a second probe must be moved among all of the other test points connected to circuit traces which are at some point adjacent to the circuit extending from the first point. With the single-probe method, the capacitance between each test point and the conductive plane is checked. If this capacitance is below an expected minimum, it is determined that an open has apparently occurred. If this capacitance is above an expected maximum, it is determined that a short has apparently occurred. Thus, the single-probe method greatly reduces the number of tests otherwise required to adequately check for shorts using the two-probe method.

Circuit test processes of these types may be performed on flexible substrates, as well as on rigid printed circuit boards. Flexible substrates include individual layers, which are eventually laminated together to form rigid multi-layer circuit boards, and flexible circuits of various types, which are increasingly used to provide circuits that can be formed into various shapes and to provide circuits that can be changed in shape during their operation. Many of these flexible materials are supplied and tested in a reel to reel form. In general, flexible materials must be supported through the test process. A backing support on the side of the materials opposite the side to which the probes are applied is particularly important, since the mechanical forces applied to the circuit by the probes must be resisted. Also, it is desirable to hold the flexible material flat during the test process, or to otherwise control its geometry relative to the locations of the probes. Furthermore, if the single-probe method is to be used with a flexible circuit not having a conductive plane, a backing plate must provide the conductive plane to which circuit capacitance is measured.

In a number of circuit applications, circuit traces are provided on both sides of flexible material. In such applications, it is particularly desirable to test both sides of the circuit simultaneously, to improve the throughput of a test process which would otherwise require two passes and to minimize damage to the circuits which might otherwise occur during handling through two passes. Circuits on the opposite sides of both circuit boards and flexible substrates are often connected by vias extending through the insulating substrate material, so that an individual circuit line extends partly along each side of the insulating material.

What is needed is a method to provide for simultaneously testing circuits on both sides of either a rigid circuit board or a flexible substrate, using either the two-probe or single probe method. This method should provide physical support to the circuit material during the engagement of various probes, while providing a conductive backing layer as required by the single-probe method, and while providing clearance for the movement of probes to engage various circuit points.

While the co-pending U.S. application cross-referenced in the preceding section, Ser. No. 08/176,810, describes an open frame gantry probing system configured particularly for testing circuits on both sides of a circuit board, mounting provisions are made only for holding a rigid circuit board within the probing system. What is needed is means for supporting a flexible substrate within the fixture and for providing the conductive backing layer required by the single-probe method.

Description of the Prior Art

A number of U.S. patents describe methods for supporting and testing integrated circuit chips placed individually on an elongated flexible strip fed through a test fixture. For test purposes, circuit traces on the strip are individually electrically connected to various circuit pads on each circuit chip. For example, U.S. Pat. No. 4,987,365 to Shreeve et al. describes the use of a pressure plate to hold the strip against a support plate, as a number of probes in a fixture are brought into contact with the strip through holes in the pressure plate, as the test is conducted with all probes held in contact with the strip, and as the probes are subsequently withdrawn away from the strip. U.S. Pat. No. 5,189,363 to Bregman et al. describes a testing system in which the tape is patterned with an array of cantilevered contact leads held in contact with the I/O terminals of the circuit chip during the testing process. U.S. Pat. No. 5,237,268 to Honma et al. describes the use of a film-like probe superimposed on the elongated flexible strip carrying the circuit chips, with circuit traces on the film-like probe connecting the circuits on the elongated flexible strip with external circuits.

While these devices are configured particularly for probing circuits extending along an elongated flexible strip, which may, for example, be presented to the test fixture as it is pulled from one reel to another, no provision is made for probing circuits on opposite sides of the strip. In the circuit chip testing application described by Shreeve, Bregman, and Honma, the circuit traces on the flexible strip are electrically connected to circuit pads extending generally around the circuit chip in such a way that there is no need to provide circuit traces on both sides of the flexible strip. Furthermore, the devices described in these patents are configured to engage various test positions on the elongated flexible strip with a fixed array of probe points. While this approach is well suited for testing circuit chips having similar patterns of I/O contacts to connect to the circuits of the elongated strip, a more flexible approach, allowing probes to be moved rapidly to form a more flexible testing system, which can handle various applications for flexible circuits having circuit lines extending along both sides of the flexible substrate, is still needed.

SUMMARY OF THE INVENTION

In accordance with one aspect of the invention, there is provided apparatus for testing circuit traces extending along a flexible substrate. The apparatus includes an upper plate, a lower plate and plate mounting hardware. The upper plate includes a number of upper apertures extending across the width of the flexible substrate. Adjacent ones of the upper apertures are separated by upper segments of the upper plate, which also extend across the width of the flexible substrate. The lower plate includes a number of lower segments extending under the upper apertures and a number of lower apertures extending under the upper segments. The plate mounting hardware holds the upper and lower plates apart, forming upper and lower surfaces of a slot for receiving the flexible substrate, while allowing movement of the flexible substrate in the direction of its length.

BRIEF DESCRIPTION OF THE DRAWINGS

A preferred embodiment of the subject invention is hereafter described with specific reference being made to the following Figures, in which:

FIG. 9 is a fragmentary cross-sectional elevation showing a cam mechanism used to move an upper plate into and out of engagement with the flexible substrate extending through the testing fixture of FIG. 1, taken as indicated by section lines IX—IX in FIG. 1;

FIG. 10 is a fragmentary cross-sectional elevation showing a cam mechanism used to move a lower plate into and out of engagement with the flexible substrate extending through the testing fixture of FIG. 1, taken as indicated by section lines X—X in FIG. 1;

FIG. 11 is a fragmentary plan view of a flexible substrate having a number of circuit areas configured for testing in the testing fixture of FIG. 1;

FIG. 12 is a fragmentary cross-sectional elevation showing the transillumination of the flexible substrate to determine the location of circuit traces thereon relative to the testing fixture of FIG. 1, taken as indicated by section lines XII—XII in FIG. 1.

DETAILED DESCRIPTION

Figure 1:
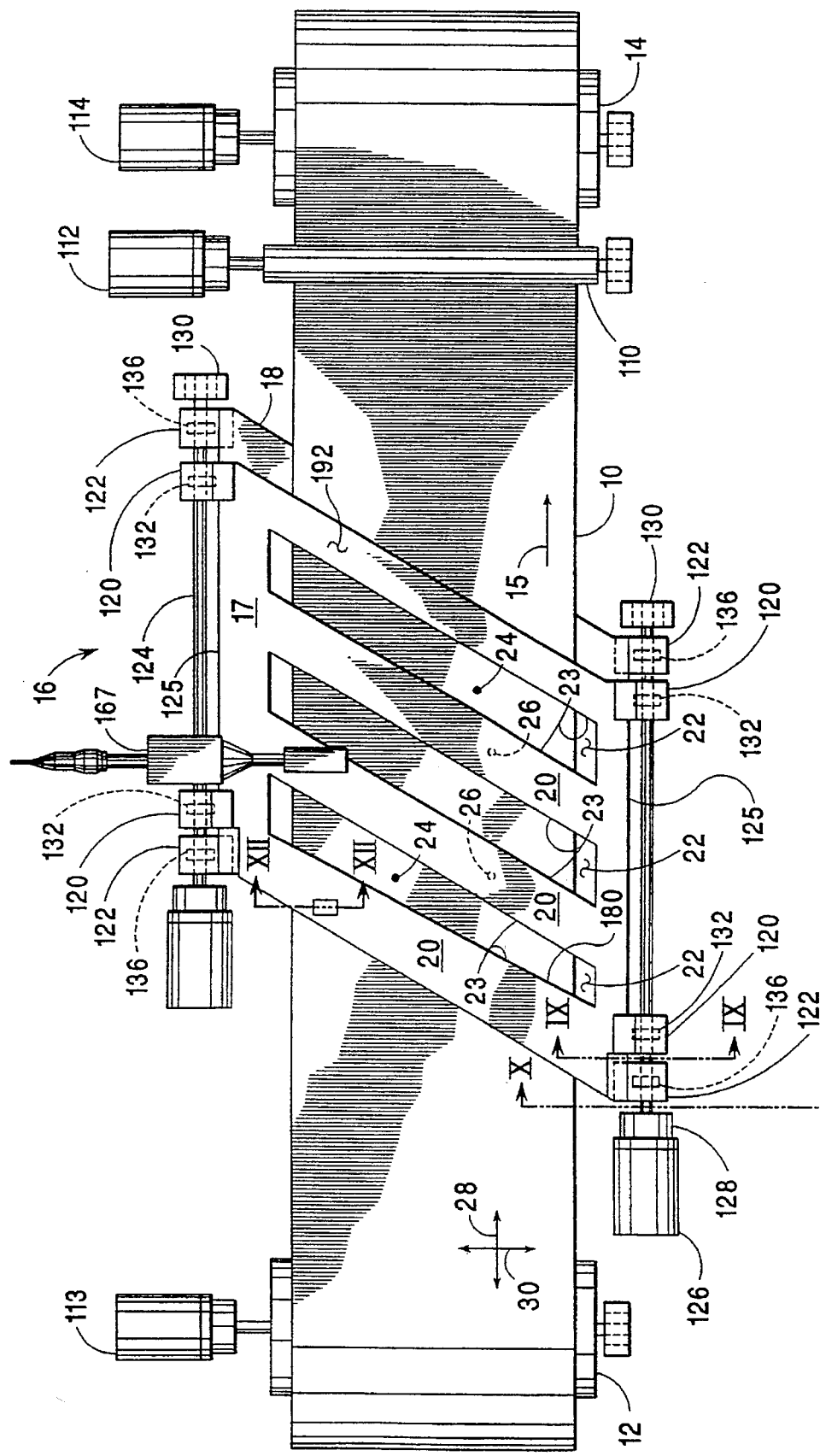
FIG. 1 is a cross-sectional plan view of a central portion of a testing fixture, through which a flexible substrate is drawn, in which the testing fixture is made in accordance with the subject invention.

FIG. 1 is a plan view of a central portion of a circuit testing fixture built in accordance with the subject invention, in which a flexible substrate 10 is pulled from a supply roll 12 to a take-up roll 14, in the direction of arrow 15, through a circuit testing fixture 16. Within circuit testing fixture 16, the flexible substrate 10 is pulled between an upper plate 17 and a lower plate 18. Upper plate 17 includes a number of upper segments 20 extending transversely above flexible substrate 10, while lower plate 18 includes a number of lower segments 22 extending transversely below flexible circuit 10. A lower segment 22 extends below each upper aperture 23 extending transversely between adjacent upper segments 20, while an upper segment 20 extends transversely above each lower aperture (not shown) extending transversely between adjacent lower segments 22. Also within circuit testing fixture 16, two upper probes 24 are moved above flexible substrate 10 and upper segments 20, while two lower probes 26 are moved below flexible substrate 10 and lower segments 22. All four probes 24 and 26 are independently moved longitudinally to flexible substrate 10, in the direction of arrow 28, and transversely to flexible circuit 10, in the direction of arrow 30. Each probe 24 is also moved downward into contact with an adjacent upper surface of flexible substrate 10, and upward to allow the passage of the probe 24 above upper segments 20. Similarly, each probe 26 is also moved upward into contact with an adjacent lower surface of flexible substrate 10 and downward to allow passage of the probe 26 below lower segments 22.

To facilitate various types of testing which may be applied to flexible substrate 10, upper plate 17 and lower plate 18 are composed of an electrically conductive material, such as a metal, with a dielectric coating applied at least to the plate surfaces adjacent to substrate 10. In this way, capacitive coupling is achieved between various circuits extending along the surfaces of substrate 10 and the plates 17 and 18, while electrical contact between such circuits and these plates is prevented.

FIG. 1 is actually a sectional plan view of testing fixture 16, as the mechanism required to support and move upper probes 24, which extends over upper plate 17, is not shown. While this mechanism is omitted from FIG. 1 because its presence would otherwise obscure the plates 17 and 18 and associated hardware, the mechanism used to move the probes 24 and 26 will now be discussed, with particular reference being made to FIG. 2.

Figure 2:
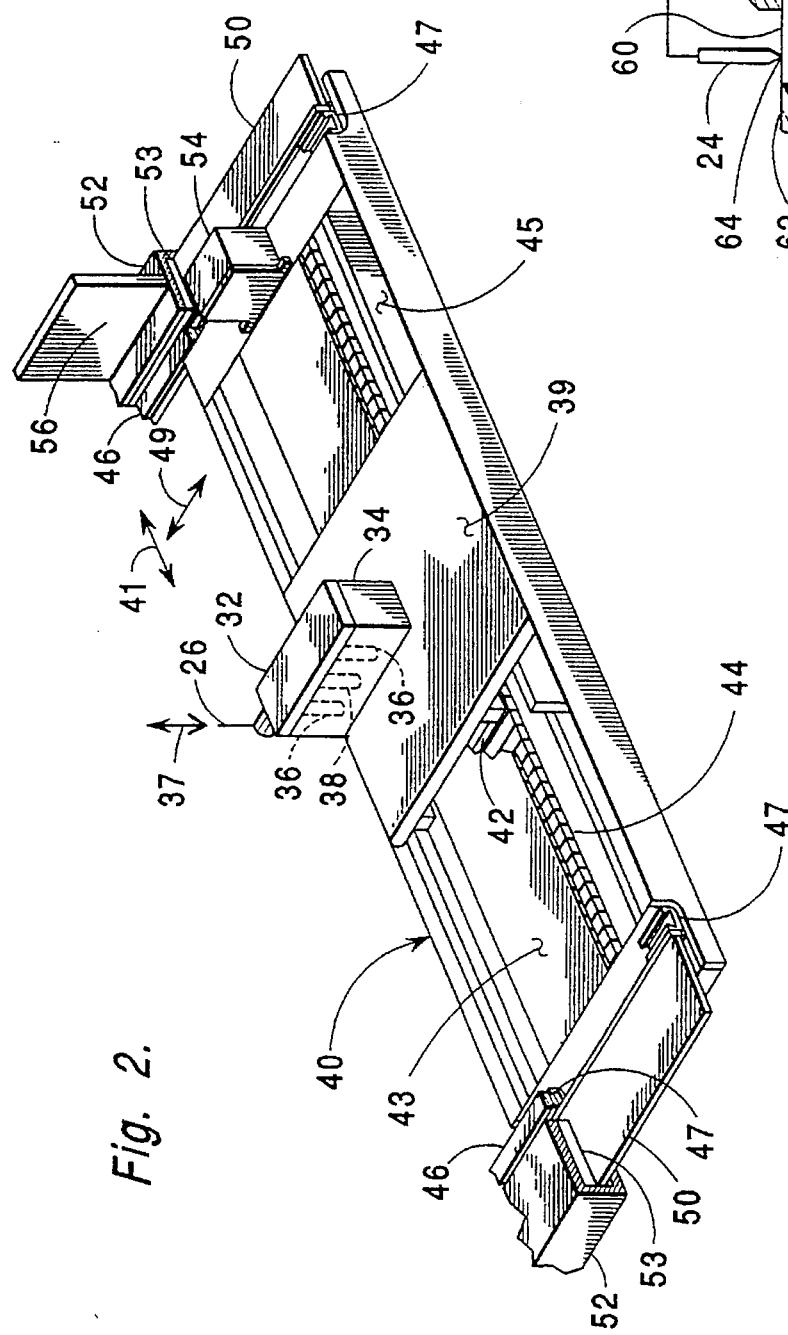
FIG. 2 is an isometric view from above a gantry assembly used to move a test probe under a portion of the flexible substrate extending through the testing fixture of FIG. 1.

FIG. 2 is an isometric view of a mechanism supporting and moving a lower probe 26 as generally described above. The probe 26 is mounted in a probe assembly 32, which is in turn mounted in a probe carrier 34 by means of a pair of air bearings 36 allowing motion of probe assembly 32 toward and away from the adjacent surface of substrate 10 (shown in FIG. 1), i.e. in the directions indicated by arrow 37. An electromagnetic actuator 38, such as a voice coil, slides probe assembly 32 along these bearings 36. Probe carrier 34 is in turn fastened to a carriage 39, which is mounted to slide along a gantry structure 40 in the directions indicated by arrow 41, being propelled by acceleration forces developed in a linear motor coil 42 sliding in a slot within a channel 43 lined with permanent magnets 44 having alternating polarities. The movement of carriage 39 in the direction of arrows 41 is tracked by an encoder read head (not shown) attached to the carriage to move adjacent to an encoder scale 45, with current levels being applied to linear motor coil 42 to move carriage 39 as required.

Gantry structure 40 is mounted on a pair of rails 46, by means of bearings 47, to move in the directions indicated by arrow 49. At each end of gantry structure 40, a linear motor coil 50 moves within a channel 52 lined with permanent magnets 53 having alternating polarities. An encoder read head 54, attached to gantry structure 40 near one end, moves adjacent to encoder scale 56, tracking the movement of gantry structure 40 in the directions of arrow 49, as electrical current levels are applied to linear motor coils 50 to move gantry structure 40 as desired.

Thus, the motion of an individual probe tip 26 in three perpendicular directions, as indicated respectively by arrows 37, 41, and 49 is achieved. As described in reference to FIG. 1, two probe tips 24 are applied to an upper side of flexible substrate 10, and two probe tips 26 are applied to a lower side of flexible substrate 10. Thus, in test fixture 16, four probe movement mechanisms of the type described in reference to FIG. 2 are required. Two gantry structures 40 are positioned to move under the flexible substrate 10 with probes 26 directed upward, while two additional gantry structures 40 are inverted from the position shown in FIG. 2, moving above flexible substrate 10 with probes 24 (shown in FIG. 1) being directed downward toward the substrate 10. On each side of flexible substrate 10, both gantry structures 40 slide on a pair of common rails 46 by means of anti-friction bearing structures, and the linear motor coils 50 associated with both gantry structures 40 on each side of flexible substrate 10 move within common magnet channels 52. A more detailed description of the gantry structures and the frame in which they are mounted to move is found in the cross-referenced co-pending U.S. application Ser. No. 08/176,810, filed Jan. 3, 1994, entitled "Open Frame Gantry Probing System."

Various examples of tests which can be performed using the apparatus of the present invention will now be discussed, with particular reference being made to FIGS. 3–7, each of which is a cross-sectional elevation showing the application of a testing method to a circuit trace extending along flexible substrate 10. In each of these Figures, the thicknesses of flexible substrate 10 and of various circuit traces extending along this circuit are exaggerated for clarity.

Figure 3:
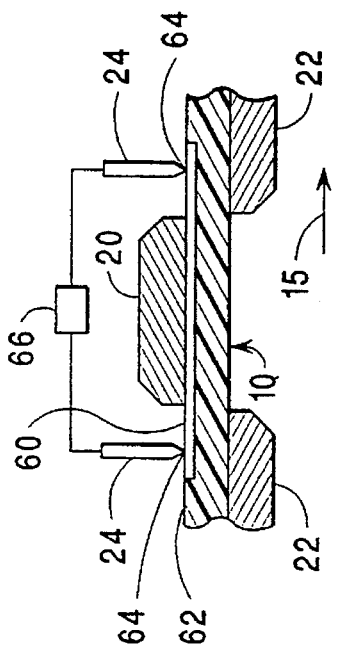
FIG. 3 is a cross-sectional elevation showing an application of a two-probe test procedure to a circuit trace extending along an upper surface of the flexible substrate extending through the testing fixture of FIG. 1.
Figure 4:
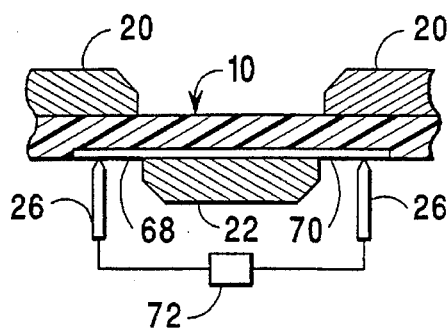
FIG. 4 is a cross-sectional elevation showing an application of a two-probe test procedure to a circuit trace extending along a lower surface of the flexible substrate extending through the testing fixture of FIG. 1.
Figure 5:
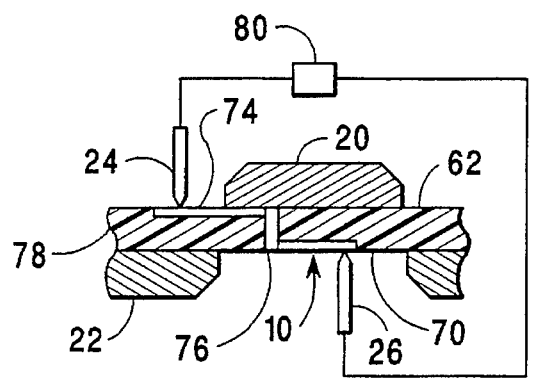
FIG. 5 is a cross-sectional elevation showing an application of a two-probe test procedure to a circuit trace extending partly along the upper surface, and partly along the lower surface, of the flexible substrate extending through the testing fixture of FIG. 1.

FIGS. 3–5 show the application of a two-probe testing method, which is used to determine electrical characteristics of the circuit trace extending between two points, or nodes, at which probes are placed. For example, electrical continuity may be checked in this way to find "opens," where a circuit which should have continuity is broken at some point, and to find "shorts," where two adjacent circuits which should be electrically isolated from each other are electrically connected. Other circuit characteristics, such as the impedance of the circuit extending between two points, can also be checked using this method.

Referring first to FIG. 3, a circuit trace 60, extending along an upper surface 62 of flexible substrate 10, is checked between two nodes 64 contacted by the two upper probes 24. Before this test can be performed, substrate 10 is fed in the direction of arrow 15 to a point at which both nodes 64 are upwardly exposed in apertures 23 between adjacent upper segments 20. Below each node 64, a lower segment 22 absorbs a portion of the force applied by a probe 24, allowing the development of sufficient force for reliable electrical contact between the tip of probe 24 and the adjacent node 64. A test circuit 66, wired between the two probes 24, provides a means for measuring the desired circuit characteristics.

While this test is shown as being applied to upward-facing nodes in upwardly-exposed apertures separated by a single upper segment 20, this choice of length for the circuit trace being tested is arbitrary. The circuit trace could as easily have been short enough to allow the application of both test probes 24 in a single upwardly-exposed aperture between two adjacent upper segments 20, or long enough to require the application of test probes in upwardly-exposed apertures separated by several upper segments 20.

FIG. 4 shows a similar situation, with the two-probe method being used to test a circuit trace 68 extending along lower surface 70 of substrate 10. In this case, a test circuit 72 is wired between lower probes 26, which are brought into contact with circuit trace 68.

Referring to FIG. 5, a circuit 74 may extend partly along upper surface 62 of substrate 10 and partly along lower surface 70, with the two segments of the circuit 74 being electrically joined by a via 76, formed by filling a hole extending through the substrate 78 of substrate 10 with a conductive material, such as a solder. In this case, a test circuit 80 is wired between an upper probe 24 and a lower probe 26, which are brought into contact with two ends of the circuit. This method of testing is particularly effective, since the electrical characteristics of via 76 are checked, along with the electrical characteristics of the portions of trace 74 extending along upper surface 62 and lower surface 70.

Figure 6:
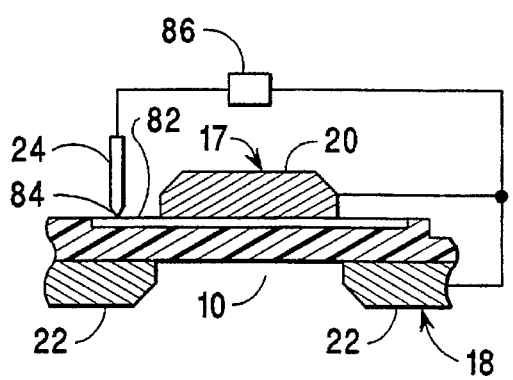
FIG. 6 is a cross-sectional elevation showing an application of a single-probe test procedure to a circuit trace extending along the upper surface of the flexible substrate extending through the testing fixture of FIG. 1, as capacitance is measured between the circuit trace and a plate structure of the testing fixture.

FIG. 6 shows a circuit trace 82 being tested using the single-probe method, as a single upper probe 24 is applied to a circuit node 84. A test circuit 86 is connected between this probe 22 and plates 17 and 18, which include segments 20 and 22. Using this method, circuit trace 82 is checked by measuring the capacitance between circuit node 84 and plates 17 and 18. This single-probe method may be readily applied to circuit traces extending along lower surface 70 of flexible substrate 10 (as shown in FIG. 4), and to circuit traces extending along both upper surface 62 and lower surface 70 (as shown in FIG. 5). For certain types of testing upper plate 17 may be electrically isolated from lower plate 18, so that the capacitance between a circuit node and one of these plates may be measured.

Figure 7:
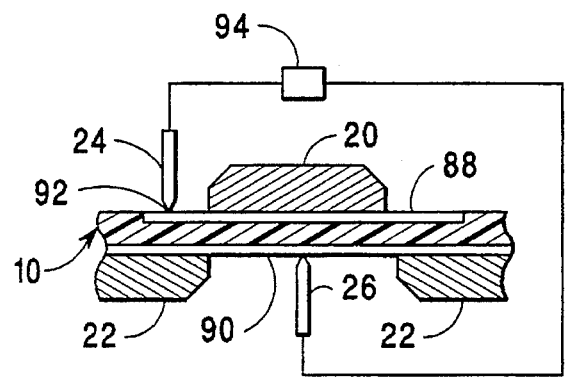
FIG. 7 is a cross-sectional elevation showing an application of a single-probe test procedure to a circuit trace extending along the upper surface of the flexible substrate extending through the testing fixture of FIG. 1, as capacitance is measured between the circuit trace and a voltage plane of the flexible substrate.

Referring to FIG. 7, in some instances, flexible substrate 10 may include a number of signal traces, such as circuit trace 88 on one side, and a voltage plane 90 extending along the side opposite the signal traces. When such a circuit is encountered, the single-probe test method may be readily applied by measuring the capacitance between a node 92 on the circuit trace 88 and the voltage plane 90. This capacitance may be measured with a test circuit 94 connected between an upper probe 24 contacting the node 92 and a lower probe 26 contacting the voltage plane 90. Despite the use of two probes in this way, this is an example of the application of the single-probe method, since only one probe is brought into contact with the circuit trace 88 being tested.

The two-probe method of FIGS. 3–5 is particularly effective in determining whether an open circuit condition, caused by a break in the circuit being tested, exists. Such a break, occurring at any point between the two nodes at which probes are placed, results in an open circuit condition between the probes, which can easily be detected by the test circuit. If a circuit trace extends to several nodes, this method may be applied several times between various nodes of the trace. On the other hand, the two-probe method is not easily applied to test for short circuits, which may appear when inadvertent electrical contact is made between adjacent circuits. An exhaustive test procedure for this condition with the two-probe method requires that all circuits adjacent to a particular circuit must be checked as the particular circuit is probed. Due to the number of tests required, this process is very time-consuming, complex, and expensive.

The single-probe method of FIGS. 6–7 is particularly effective in determining whether short circuits exist in flexible circuit 10. For example, referring to FIG. 6, if circuit trace 82 is electrically connected to an adjacent circuit (not shown) by a short, the capacitance measured at node 84 is typically increased considerably, so that this condition can be easily recognized by test circuit 86. The testing of flexible substrate 10 for shorts proceeds much more rapidly with this method than with the two-probe method, since, with the single-probe method, it is necessary, at most, to probe each circuit trace only once. On the other hand, the single probe method may not be as fast or accurate as the two-probe method in finding open circuits.

Since a single flexible substrate 10 may include circuits to be tested on each side, and since typical test requirements specify a need to test various circuits for both open conditions and shorts, it is particularly advantageous that circuit testing apparatus should be capable of applying tests using both the single-probe method and the two-probe method to both sides of the flexible substrate. To maximize the throughput of the test process, and to minimize the physical handling of the flexible circuit, since such handling may result in damage to the circuit, it is especially desirable that both types of testing should be applied to both sides of the flexible substrate during a single pass of the flexible substrate through the test fixture. The present invention has such capabilities, which provide it with a number of advantages over various types of test equipment available in the background art and described in the prior art.

Figure 8:
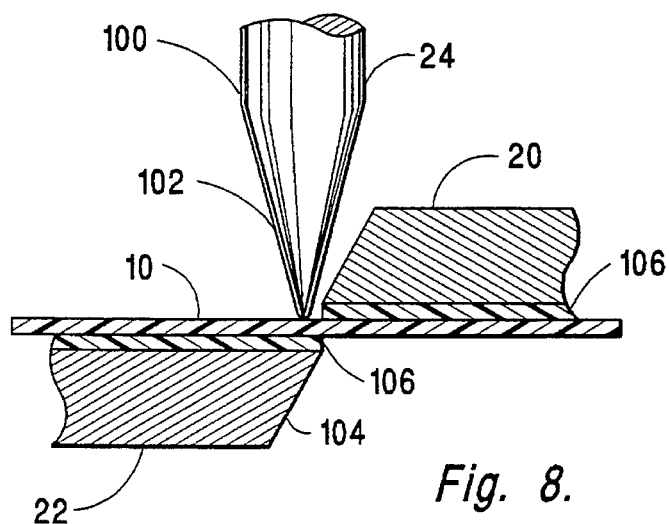
FIG. 8 is a cross-sectional elevation showing a tip of a probe and the edges of plates in the testing fixture of FIG. 1.

FIG. 8 is a cross-sectional view showing examples of the actual configurations of the tip of probe 24 and of the edges of upper segments 20 and lower segments 22. Each probe 24 or 26 includes a cylindrical portion 100, having a diameter of 0.014 in. (0.36 mm), and a conical portion 102, having a surface formed at an included angle of 30 degrees. The tip of conical portion 102 is spherically rounded. Each plate 20 and 22 is 0.013 in. (0.33 mm) thick, with a beveled edge 104 allowing a probe tip 24 or 26 to be moved closely adjacent to the plate 20 or 22 without contact occurring between the tip and the plate. An insulating layer 106 extending along the surface of each plate 20 or 22 is 0.002 in. (0.05 mm) thick. Flexible substrate 10 is also, for example, 0.002 in. (0.05 mm) thick.

Referring again to FIG. 1, while the various types of testing described above, in reference to FIGS. 3–7 may be performed in a single pass of flexible substrate 10 between plates 17 and 18 in the direction of arrow 15, this flexible substrate 10 must typically be stopped and moved a number of times in the process. To facilitate such motion, a pair of nip rolls 110 is driven, advancing flexible substrate 10 so that different areas of the upper and lower surfaces of this substrate 10 are exposed through upper and lower apertures for contact by probes 24 and 26, and stopping the motion of substrate 10 as required for the performance of various tests. One of the nip rolls 110 is accurately driven by a first servomotor 112, while the other nip roll 110, on the side of flexible substrate 10 opposite the driven nip roll 110, is an idler roller providing a clamping force on flexible substrate 10 as it passes between these rolls 110. In this way, flexible substrate 10 is constrained to move according to the rotation provided by first servomotor 112 with minimal slippage. A second servomotor 113 is preferably used to provide a torque retarding the motion of flexible substrate 10 in the direction of arrow 15. Thus, a tension is applied to flexible substrate 10, preventing slack which would otherwise allow the circuit to hang down and drag against various surfaces as it is moved. Take-up roll 14 is driven by a third servomotor 114, so that flexible substrate 10 is wound onto this roll 14 as it is fed through the nip formed between rolls 110 and 114.

It is understood that a number of somewhat different technologies can readily be used to provide the desired results in feeding flexible substrate 10. For example, either or both of servomotors 112 and 114 may be replaced by stepper motors, and servomotor 113 may be replaced by a braking device to maintain tension in the substrate. Manual or automatic adjustments of roller alignment may be applied to achieve the proper tracking of the substrate 10 through the apparatus. Various components of an automated system for feeding a flexible web, such as flexible substrate 10, may be obtained from Preco Industries, Inc. of Lanexa, Kans.

Means are also provided for separating upper plate 17 from lower plate 18, allowing free movement of flexible substrate 10 between these plates without clamping or otherwise causing unnecessary drag. Continuing to refer to FIG. 1, upper plate 17 is attached at each corner to an upper plate block 120, and lower plate 18 is attached at each corner to a lower plate block 122. A shaft 124 extends parallel to flexible circuit 10 and adjacent to each longitudinally-extending edge 125 of plate 17, being driven by a motor 126 through a gear box 128 at one end and being rotatably mounted in a bearing block 130 at the other end.

FIG. 9 is a partial cross-sectional elevation, taken as indicated by section lines IX—IX in FIG. 1, showing a cam mechanism used at each corner of upper plate 17 to move this plate 17 into and out of engagement with flexible substrate 10. An upper plate drive cam 132, attached to shaft 124, rotates with the shaft within a hole 134 in upper block 120.

FIG. 10 is a partial cross-sectional elevation, taken as indicated by section lines X—X in FIG. 1, showing a cam mechanism similarly used at each corner of lower plate 18 to move this plate 18 into and out of engagement with flexible substrate 10. A lower plate drive cam 136, attached to shaft 124, rotates with the shaft within a hole 138 in lower block 140.

As shown in FIGS. 9 and 10, both upper plate 17 and lower plate 18 are held in engagement with flexible substrate 10 by means of the eccentric surfaces of cams 132 and 136. Since the cams 132 and 136 are arranged on shaft 124 in a 180-degree out-of-phase relationship, with the eccentricities of the surfaces of these cams being aligned on diametrically opposite sides of shaft 124, upper plate 17 is held in its lowest position, while lower plate 18 is held at its highest position. In this way both plates 17 and 18 are held against flexible substrate 10. Subsequent rotation of each shaft 124, with all the associated plate drive cams 132 and 136, drives plates 17 and 18 apart, releasing flexible substrate 10 to allow its free movement. Since both cams 132 are arranged on each shaft with their outer surfaces aligned coaxially with one another, and since both cams 136 are arranged on each shaft with their outer surfaces also aligned coaxially with one another, the four corners of each plate 17 or 18 are driven upward or downward together, as long as the two shafts 124 are rotated together.

This rotation of shaft 124 also produces lateral movement of plates 17 and 18. For example, if shaft 124 is rotated a half-revolution in the direction of arrow 142 to fully disengage plates 17 and 18 from flexible substrate 10, upper plate 17 is moved in the direction of arrow 144, while lower plate 18 is moved opposite the direction of arrow 144. To produce identical motions at each corner of plates 17 and 18, the rotational motion of the two shafts 124 is synchronized. In this way, the plates 17 and 18 are driven and supported in both horizontal and vertical directions by engagement with cams 132 and 136; additional bearing supports for the plates 17 and 18 are not required. This arrangement also provides a particular advantage in that, with the lack of a bearing arrangement, a minimal space is required in the directions extending perpendicular to arrow 144.

While the above description, with reference to FIGS. 1, 9, and 10, indicates that upper plate 17 and lower plate 18 are moved apart through equal and opposite distances to allow the movement of flexible substrate 10, it is evident that, in some applications it is necessary to move only one of the plates 17 or 18 for this purpose. In this regard, it is particularly desirable to move only the lower plate 18, leaving the upper plate 17 stationary. In this situation, a separation between upper plate 17 and flexible substrate 10 can be achieved by allowing the flexible substrate to sag between the plates 17 and 18.

FIG. 11 is a fragmentary plan view of a preferred version of flexible substrate 10, which includes a number of circuit areas 150 arranged in a longitudinally extending pattern. Each circuit area 150 comprises a section of flexible circuit 10 that will be made into an individual section forming all or part of an individual product. Thus, at some point after the completion of testing in testing fixture 16 (shown in FIG. 1), flexible substrate 10 is cut into a number of sections, each of which comprises an area 150. Before flexible substrate 10 is separated in this way, a number of additional manufacturing steps may be completed. For example, electronic components may be attached to the substrate 10, or the substrate 10 may be laminated with one or more other flexible substrates to form a multi-layer printed circuit board.

Flexible substrate 10 is preferably composed of a translucent insulating substrate on which a number of opaque conductive traces 152 are formed. A number of well-known processes may be employed both for forming a suitable insulating substrate and for forming the pattern of conductive traces on one or both sides thereof. The pattern of traces 152 within each area 150 is preferably identical, so that an identical series of tests can be applied to each area 150 as flexible substrate 10 is moved through testing fixture 16 (shown in FIG. 1) in the direction of arrow 15.

The process of forming the various conductive traces 152 is preferably also used to form locating indicia 154, on a surface of flexible substrate 10, having a fixed relationship with the conductive traces of each circuit area 150. Thus, for example, two tracks of locating indicia are formed, with each track extending longitudinally along the flexible substrate 10. A first track includes a single circuit reference mark 155, in a location corresponding with each circuit area 150, while a second track includes a number of scale marks 156 separated from one another by a fixed, relatively small distance.

FIG. 12 is a fragmentary cross-sectional elevation, taken as indicated by section lines XII—XII in FIG. 1, showing a means for determining the position of each circuit area 150 (shown in FIG. 11) relative to testing fixture 16. An illumination source 160 is placed below lower plate 18, backlighting an adjacent portion of flexible substrate 10 through an aperture 162 in a section 22 of lower plate 18. A first photodetector 164 is aligned to detect the adjacent passage of each reference mark 155, while a second photodetector 166 is aligned to detect the adjacent passage of each scale mark 156. Thus, the output of first photodetector 164 indicates the passage, by a known point in testing fixture 16, of a point having a known relationship to one of the circuit areas 150 (shown in FIG. 12), while the accumulation of pulses produced with the output of second photodetector 166 indicates the accumulated distance through which flexible substrate 10 moves. For example, the output of second photodetector 166 may be fed into a counter which is reset by an input provided by the output of first photodetector 164 with the passage of each circuit locating mark 155. This technique can be used for keeping track of the movement of flexible substrate 10, even when the circuit is slowed and stopped to accommodate the testing process.

Referring again to FIGS. 1 and 11, a television camera 167 may be used as an alternative to the photodetectors 164 and 166, which have been described above in reference to FIG. 12, or as an additional means for obtaining positional information, along with these photodetectors. The means provided for determining the location of circuit areas 150 relative to testing fixture 16 are preferably capable of establishing this location in the transverse direction of arrow 30 as well as in the longitudinal direction of arrow 28. The image of reference mark 155, as detected by television camera 167, may be used to provide information on the location of each circuit area 150 in the transverse direction of arrow 30, with reference mark 155 being located accurately with respect to an adjacent circuit area 150 in both transverse and longitudinal directions. Alternately, the location, in the transverse direction, of the images detected by television camera 167 of scale marks 156 may be used to determine the location of circuit traces 152 in the transverse direction on a continuous basis. Since the locating indicia 154 are applied by the manufacturing process which forms the various circuit traces 152, these methods may be used to compensate both for variations in the placement of these traces 152 on flexible substrate 10 and for variations in the tracking of substrate 10 through testing fixture 16 (i.e. for variations in the location of substrate 10 in the transverse direction within fixture 16).

Light required for the operation of television camera 167 may be provided through backlighting, as discussed in reference to FIG. 12, or through various well-known techniques for front-lighting, from the side of flexible substrate 10 on which television camera 167 is placed. The choice of lighting techniques may be varied, for example, depending on the characteristics of flexible substrate 10 relative to the transmission and reflection of light.

Thus, the methods discussed above may be used to determine the location of each circuit area 150 in both transverse and longitudinal directions, relative to a reference frame fixed within the testing fixture 16. Such a fixed reference may be, for example, located at the center of the area viewed by television camera 167.

Referring again to FIG. 2, the position of each probe 24 (shown in FIG. 1) or 26 is tracked by means of an encoder read head 54 moving along an encoder scale 56, in the direction of arrow 49, and by an encoder read head (not shown) attached to carriage 39, moving along an encoder scale 45, in the direction of arrow 41. During the testing process, it is necessary to move the probes 24 and 26 to various points on each of the circuit areas 150. This is accomplished using a data file indicating the various locations which must be accessed within each circuit area 150, using the methods discussed in reference to FIG. 11 to determine the location of each circuit area 150 relative to the testing fixture 16, and using the methods discussed in reference to FIG. 2 to determine the location of each probe within the testing fixture 16.

Referring again to FIG. 11, while a test point may generally be located at any point within a circuit area 150, circuits are normally laid out to extend along coordinates in such a way that test points on an individual circuit trace are often located, relative to one another, in the longitudinal direction indicated by arrow 28 or in the transverse direction indicated by arrow 30. Therefore, measurements made between probes separated in either of these directions are given particular consideration in the configuration of testing fixture 16. Considerations affecting the configuration of testing fixture 16 will now be discussed with particular reference to FIGS. 13-15.

Figure 13:
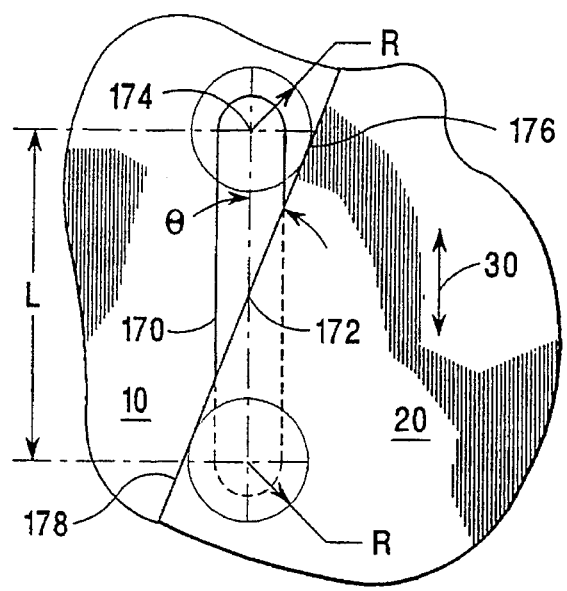
FIG. 13 is a fragmentary plan view of a short circuit trace having transversely disposed test points, being tested by the two-probe method in the testing fixture of FIG. 1.

FIG. 13 is a plan view showing the application of the two-probe test procedure to a circuit trace 170 extending along both sides of flexible substrate 10, so that the circuit probes must be applied to opposite sides of the flexible substrate, being separated by a relatively short distance in a transverse direction of arrow 30. The general application of this test process to a circuit extending along both sides of the flexible substrate has previously been discussed with reference to FIG. 5. Since it is necessary to have simultaneous access to both test points on opposite sides of flexible substrate 10, this test cannot be applied to a circuit of any length extending in the direction of arrow 30, if the edges of upper segments 20 and lower segments 22 also extend in the direction of arrow 30. For this reason, the edges of various segments 22 are inclined at an angle Θ with respect to the transverse direction of arrow 30. This angle may be determined from the length, L, of the shortest expected center-to-center distance between points aligned along the direction of arrow 30, and the minimum radius, R, to be allowed for the probe and clearance to an adjacent edge of a segment 20 or 22. An examination of the triangle formed by the midpoint 172, a probe center point 174, and a point 176, at which an edge 178 of upper segment 20 is tangent to a circle of radius R centered at point 172, indicates that:

$$\sin\Theta = \frac{R}{\frac{L}{2}} = \frac{2R}{L}$$

Thus, the angle of inclination is given by:

$$\Theta = \arcsin\frac{2R}{L}$$

Referring again to FIG. 1, one of the upper edges 180 of an upper segment 20 and the corresponding lower edge of a lower segment (not shown) are inclined at an angle differing from the angle Θ at which edges of the other segments 20 and 22 are inclined. This difference makes it possible to apply the two-probe test procedure to a circuit trace (not shown) extending along both sides of flexible substrate 10 when a line between the test points is inclined at the angle Θ, provided the distance between test points is sufficient to provide the clearance discussed in reference to FIG. 13.

Figure 14:
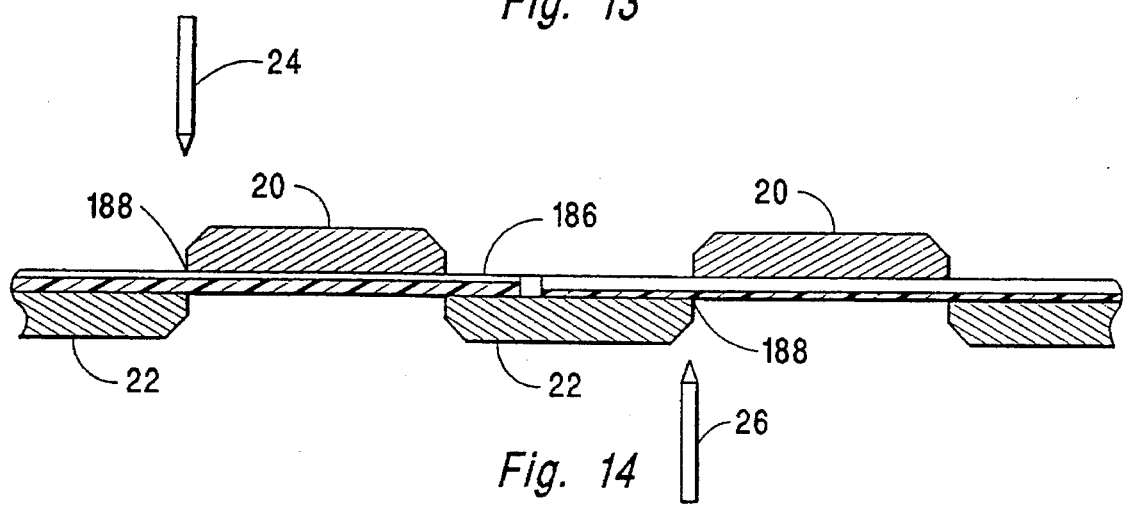
FIG. 14 is a fragmentary cross-sectional elevation showing the problem associated with the application of the two-probe test method to test points separated in the longitudinal direction by a distance equal to an even number of widths of the sections of plates in the testing fixture of FIG. 1.

FIG. 14 is a cross-sectional elevation showing how a similar problem can occur as the two-probe test procedure is applied to a circuit trace 186 having test points 188 on opposite sides of flexible substrate 10, spaced apart so that they fall at the edges of differing segments 20 and 22, with an even number of segments between the test points. If all of the segments 20 and 22 are the same width, this test cannot be applied under these conditions.

Figure 15:
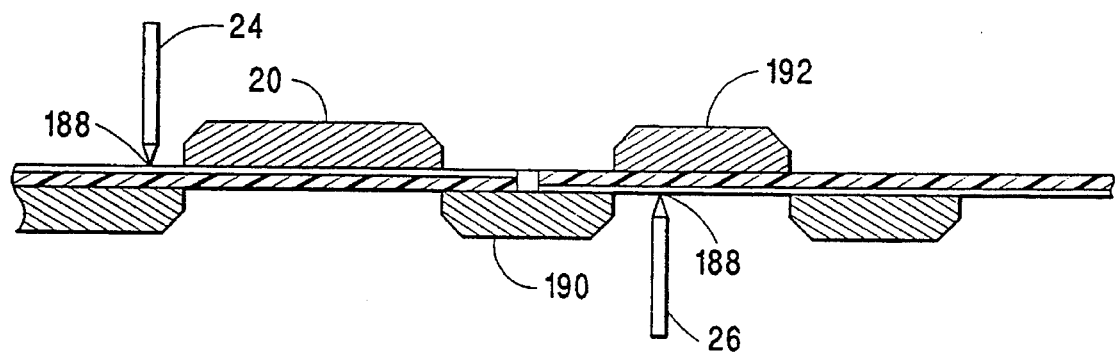
FIG. 15 is a fragmentary cross-sectional elevation showing how the problem of FIG. 14 may be averted by providing plate sections of differing widths.

FIG. 15 is a cross-sectional elevation showing how this problem is averted by providing an intervening segment 190 having a different (in this example, narrower) width. Preferably both a lower segment 190 and an upper segment 192 having narrower widths are provided, so that this problem is averted whether the leftmost test point is on the upper or lower side of flexible substrate 10.

Figure 16:
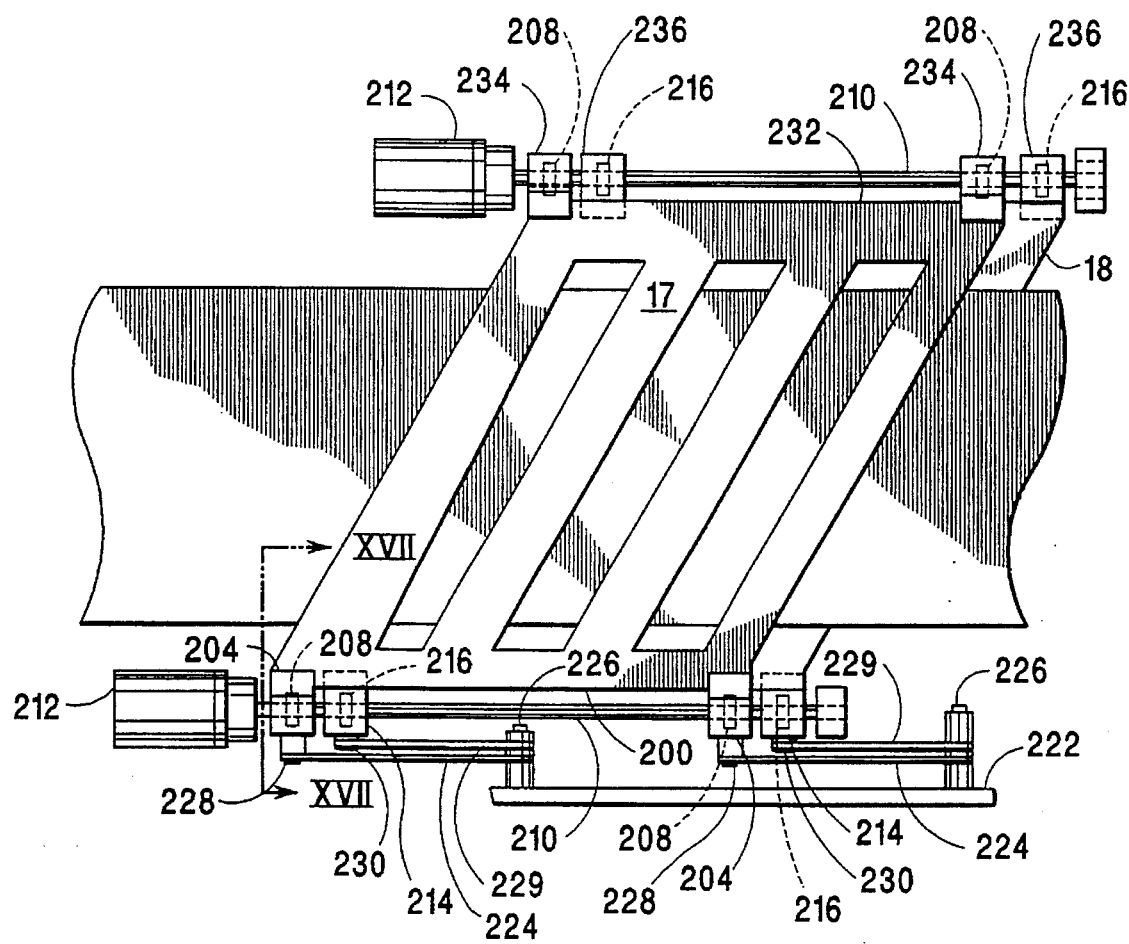
FIG. 16 is a plan view of a testing fixture made in accordance with the subject invention, using an alternative method of supporting upper and lower plates.

An alternate method for movably supporting upper plate 17 and lower plate 18 will now be discussed, with particular reference being made to FIGS. 16 and 17. FIG. 16 is a fragmentary plan view showing the application of this method, and FIG. 17 is a fragmentary cross-sectional elevation, taken as indicated by section lines XVII—XVII in FIG. 16, showing a cam follower block arrangement for moving upper plate 17.

Referring first to FIG. 16, upper plate 17 is attached along a longitudinally-extending edge 200 to a pair of upper plate cam follower blocks 204, in which a pair of upper plate drive cams 208 turn, being attached to a shaft 210 driven by a motor 212. Similarly, lower plate 18 is attached along an edge extending adjacent to edge 200, to a pair of lower plate cam follower blocks 214, in which a pair of lower plate drive cams 216 turn, being also attached to shaft 210.

Figure 17:
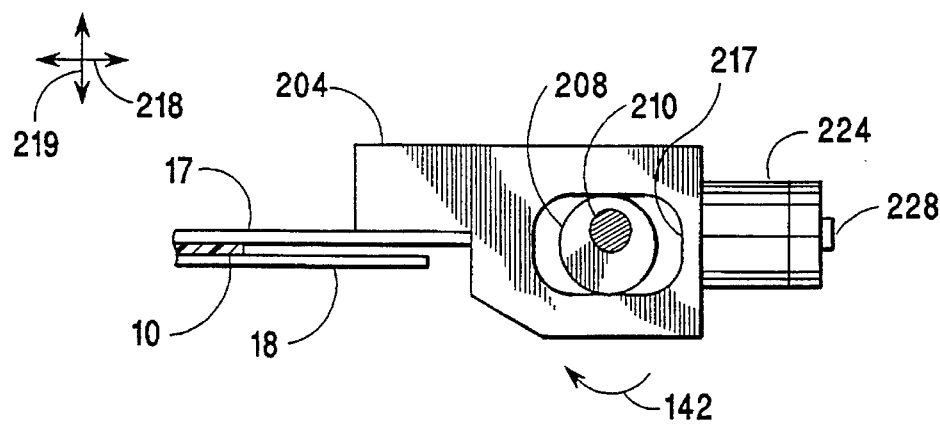
FIG. 17 is a fragmentary cross-sectional elevation showing a cam mechanism used to move an upper plate into and out of engagement with a flexible substrate extending through the testing fixture of FIG. 16, taken as indicated by section lines XVII—XVII in FIG. 16.

Referring to FIG. 17, each upper plate cam follower block 204 includes an aperture 217, slotted to be elongated in the horizontal direction of arrow 218, in which the associated cam 208 turns, imparting vertical motion, in a direction of arrow 219, to the cam follower structure, without imparting horizontal motion, in the direction of arrow 218, thereto.

Referring again to FIG. 16, each lower plate cam follower block 214 includes an aperture (not shown), which is also horizontally slotted as described in reference to FIG. 17. Lower plate drive cams 216 are arranged on shaft 210 in a manner 180 degrees out of phase from upper plate drive cams 208, so that, with the rotation of shaft 210, cams 216 drive lower plate 18 upward into engagement with flexible substrate 10, while cams 208 drive upper plate 17 downward to also engage substrate 10. In this regard, the vertical movement of plates 17 and 18 is accomplished generally as previously described in reference to FIGS. 1, 9, and 10.

Upper plate 17 is movably mounted to a stationary frame member 222 by means of a pair of upper plate pivot arms 224, each of which is pivotally mounted at one end to a frame pivot 226 and at an opposite end to a pivot 228 extending from an upper plate cam follower block 204. Similarly, lower plate 18 is movably mounted to frame member 222 by means of a pair of lower plate pivot arms 229, each of which is pivotally mounted at one end to frame pivot 226 and at an opposite end to a pivot 230 extending from a lower plate cam follower block 214.

A second shaft 210, having cams 208 and 216 attached to provide motions as described above, extends along an edge 232 of upper plate 17, being driven by a second motor 212. This edge 232 is opposite longitudinally-extending edge 200. Along this edge 232, upper plate cam follower blocks 234, in which cams 208 turn, are similar to upper plate cam follower blocks 204, except that a pivot for mounting a pivot arm is not provided. Likewise, lower plate cam follower blocks 236, in which cams 216 turn, are similar to lower plate cam follower blocks 214, except that a pivot for mounting a pivot arm is again not provided. The two motors 212 are driven so that the cams 208 and 210 move together, for example, between a first position, in which plates 17 and 18 are held against flexible substrate 10 and a second position, in which the distance between plates 17 and 18 is increased to release flexible substrate 10.

Thus, as upper plate 17 is driven upward by the rotation of the two shafts 210, the vertical motions of all four corners of this plate 17 are equal, being provided by four identical cams 208. As this vertical motion occurs, each of the two pivots 228 must move in an arcuate path about the frame pivot 226 to which it is attached by a pivot arm 224. Therefore, any point on plate 17 moves in a similar arcuate path. While the pivot arms 224 are allowed to pivot freely with the motions provided by cams 208, these arms 224 are preferably individually rigid enough to prevent significant deflection or twisting. Under these conditions, it is unnecessary to provide additional pivot arms, or other guide means, along edge 232. The downward movement of lower plate 18 is similarly controlled by the pivoting movement of pivot arms 228. Thus, while cams 208 and 216 provide the upward and downward motion of plates 17 and 18, pivot arms 224 and 229 define the path each plate takes as it is moved upward and downward.

Compared to the method for controlling the movement of plates 17 and 18 described in reference to FIGS. 1, 9, and 10, the method of FIGS. 16 and 17 has a disadvantage of additional complexity. However, while the method of FIGS. 1, 9, and 10 brings plates 17 and 18 into contact with flexible substrate 10 tangentially, the method of FIGS. 16 and 17 brings these plates into contact with the substrate in directions nearly perpendicular to the surface of the substrate. Thus, the method of FIGS. 16 and 17 can be used in applications which are particularly sensitive to the occurrence of damage along the surfaces of the substrate or of the conductive traces extending along these surfaces.

Referring again to FIG. 1, a typical circuit area 150 (shown in FIG. 11) to be tested includes a number of circuit traces having both ends easily exposed within a single aperture between adjacent upper segments 20 or lower segments 22. Other circuit traces may extend past several segments 20 or 22 between the test points to be contacted using the two-probe testing method. In general, it is necessary to move the flexible substrate 10 several times to access all of the points needed for testing by either or both the single-probe method and/or the two-probe method. This movement is preferably accomplished by moving the substrate 10 in several incremental motions in the direction of arrow 15 as each circuit area 150 is moved between upper plate 17 and lower plate 18. These incremental motions do not have to be equal in length, as the length of each motion is determined by the geometrical configurations of the circuit traces and by the circuit points which have to be accessed to perform the required tests. At each stopping point, any combination of tests may be performed using the single-probe method and the two-probe method, with probes being moved into contact with accessible test points on both sides of the substrate 10. Tests may be applied to adjacent circuit areas 150 while both such circuit areas are stopped between plates 17 and 18.

Before a newly-defined circuit 150 is tested, its geometry is studied to determine the optimum positions at which the circuit is stopped for test procedures and optimum methods for applying these test procedures.

After the test process is completed, the flexible substrate is typically cut into a number of segments, each of which includes a single circuit area 150. Each segment may, for example, be populated with components, such as connectors, to become a flexible circuit board. A board of this type can be used as a flexible cable having additional logic functions. Alternately, a number of different segments of flexible substrates may be laminated to form a multi-layer rigid circuit board.

While the invention has been described in its preferred form or embodiment with some degree of particularity, it is understood that this description has been given only by way of example and that numerous changes in the details of construction, fabrication and use, including the combination and arrangement of parts, may be made without departing from the spirit and scope of the invention.

What is claimed is:

1. Apparatus for testing circuit traces extending along a flexible substrate, wherein said apparatus comprises:

an upper plate including a plurality of transversely extending upper apertures separated by transversely extending upper segments of said upper plate;

a lower plate including lower segments extending individually under said upper apertures and lower apertures extending transversely between said lower segments; and plate mounting means for holding said upper and lower plates in a spaced-apart relationship to form upper and lower surfaces of a substrate receiving slot, while allowing movement of said flexible substrate in a longitudinal feed direction through said substrate receiving slot, wherein said plate mounting means includes lower plate moving means for moving said lower plate between a lower plate closed position, in which said lower plate is held upward to clamp said substrate extending within said substrate receiving slot and a lower plate open position, in which said lower plate is lowered, releasing said substrate to move between said upper and lower plates, wherein said plate mounting means additionally includes upper plate moving means for moving said upper plate between an upper plate closed position, in which said upper plate is held downward to clamp said substrate extending within said substrate receiving slot, and an upper plate closed position, in which said upper plate is raised, releasing said substrate to move between said upper and lower plates, wherein said upper plate moves from said upper plate closed position to said upper plate open position as said lower plate moves from said lower plate closed position to said lower plate open position; and wherein said upper plate moves from said upper plate open position to said upper plate closed position as said lower plate moves from said lower plate open position to said lower plate closed position.

2. Apparatus for testing circuit traces extending along a flexible substrate, wherein said apparatus comprises:

an upper plate including a plurality of transversely extending upper apertures separated by transversely extending upper segments of said upper plate;

a lower plate including lower segments extending individually under said upper apertures and lower apertures extending transversely between said lower segments; and plate mounting means for holding said upper and lower plates in a spaced-apart relationship to form upper and lower surfaces of a substrate receiving slot, while allowing movement of said flexible substrate in a longitudinal feed direction through said substrate receiving slot, wherein said plate mounting means includes lower plate moving means for moving said lower plate between a lower plate closed position, in which said lower plate is held upward to clamp said substrate extending within said substrate receiving slot and a lower plate open position, in which said lower plate is lowered, releasing said substrate to move between said upper and lower plates, and wherein said lower plate moving means includes a rotatably mounted shaft extending along each longitudinally-extending edge of said lower plate, two lower plate moving cams fastened in a spaced-apart relationship to each said shaft to turn therewith, each said lower plate moving .cam having a cylindrical outer surface in an eccentric relationship with said shaft, said outer surfaces of said lower plate moving cams being coaxial, four lower plate moving blocks attached to said lower plate in a spaced-apart relationship, each said lower plate moving block having a cylindrical aperture in which an outer surface of a said lower plate moving cam turns, and means to turn said shafts together, through a half-revolution, between a first shaft angular position, in which said lower plate is held in said closed position, and a second shaft angular position, in which said lower plate is held in said open position.

3. The apparatus of claim 2, wherein said plate mounting means includes in addition:

two upper plate moving cams fastened in a spaced-apart relationship to each said shaft to turn therewith, each said upper plate moving cam having a cylindrical outer surface in an eccentric relationship with said shaft, said outer surfaces of said upper plate moving cams being coaxial, wherein an axis of said outer surfaces of said upper plate moving cams extends along each said shaft diametrically opposite to an axis of said outer surfaces of said lower plate moving cams; and four upper plate moving blocks attached to said upper plate in a spaced-apart relationship, each said upper plate moving block having a cylindrical aperture in which an outer surface of said upper plate moving cam turns.

4. The apparatus of claim 1, wherein said lower plate moving means includes:

a rotatably mounted shaft extending along each longitudinally-extending edge of said lower plate;

two lower plate moving cams fastened in a spaced-apart relationship to each said shaft to turn therewith, wherein a surface of each said lower plate moving cam has a low point, at which said surface is closest to said shaft, and a high point, at which said surface is farthest from said shaft, said high point being diametrically opposite said low point, said low points of said lower plate moving cams being angularly aligned along each said shaft;

four lower plate cam followers fastened to said lower plate in a spaced-apart relationship, each said lower plate cam follower engaging said lower plate moving cam to be moved thereby;

means to turn said shafts together, through a half-revolution, between a first shaft angular position, in which said lower plate is held in said closed position, and a second shaft angular position, in which said lower plate is held in said open position; and lower plate guide means for restraining said lower plate to follow a defined path into and out of contact with said substrate extending between said upper and lower plates.

5. The apparatus of claim 4, wherein said plate mounting means includes in addition:

two upper plate moving cams fastened in a spaced-apart relationship to each said shaft to turn therewith, wherein a surface of each said upper plate moving cam has a low point, at which said surface is closest to said shaft, and a high point, at which said surface is farthest from said shaft, said high point being diametrically opposite said low point, said low points of said upper plate moving cams being angularly aligned along each said shaft, said low points of said upper plate moving cams being diametrically opposite said low points of said lower plate moving cams on each said shaft;

four upper plate cam followers fastened to said upper plate in a spaced-apart relationship, each said upper plate cam follower engaging said upper plate moving cam to be moved thereby;

upper plate guide means for restraining said upper plate to follow a path into and out of contact with said substrate extending between said upper and lower plates.

6. Apparatus for testing circuit traces extending along a flexible substrate, wherein said apparatus comprises:

an upper plate including a plurality of transversely extending upper apertures separated by transversely extending upper segments of said upper plate, wherein a first plurality of edges of said upper segments extend across said substrate receiving slot at a first common oblique angle;

a lower plate including lower segments extending individually under said upper apertures and lower apertures extending transversely between said lower segments, wherein a second plurality of edges of said lower segments extend across said substrate receiving slot at said common oblique angle; and plate mounting means for holding said upper and lower plates in a spaced-apart relationship to form upper and lower surfaces of a substrate receiving slot, while allowing movement of said flexible substrate in a longitudinal feed direction through said substrate receiving slot.

7. The apparatus of claim 6, wherein an edge of a certain said upper segment and an adjacent edge of a certain said lower segment extend across said substrate receiving slot at a second common oblique angle substantially different from said common oblique angle.

8. Apparatus for testing circuit traces extending along a flexible substrate, wherein said apparatus comprises:

an upper plate including a plurality of transversely extending upper apertures separated by transversely extending upper segments of said upper plate, wherein said upper plate includes a conductive upper layer and an insulating lower layer;

a lower plate including lower segments extending individually under said upper apertures and lower apertures extending transversely between said lower segments, wherein said lower plate includes a conductive lower layer and an insulating lower layer; and plate mounting means for holding said upper and lower plates in a spaced-apart relationship to form upper and lower surfaces of a substrate receiving slot, while allowing movement of said flexible substrate in a longitudinal feed direction through said substrate receiving slot.

9. The apparatus of claim 8:

wherein said conductive upper and lower layers are composed of a metal 0.013 inch thick; and wherein said insulating upper and lower layers are composed of a thermoplastic material 0.002 inch thick.

10. Apparatus for testing circuit traces extending along a flexible substrate, wherein said apparatus comprises:

an upper plate including a plurality of upper apertures separated by upper segments of said upper plate, wherein each said upper aperture has a pair of transversely-extending, straight, parallel edges, and wherein each said upper segment has a pair of transversely-extending, straight, parallel edges;

a lower plate including lower segments extending individually under said upper apertures and lower apertures extending transversely between said lower segments, wherein each said lower aperture has a pair of transversely-extending, straight, parallel edges, and wherein each said lower segment has a pair of transversely-extending, straight, parallel edges; and plate mounting means for holding said upper and lower plates in a spaced-apart relationship to form upper and lower surfaces of a substrate receiving slot, while allowing movement of said flexible substrate in a longitudinal feed direction through said substrate receiving slot.

11. The apparatus of claim 10, wherein said plate mounting means includes lower plate moving means for moving said lower plate between a lower plate closed position, in which said lower plate is held upward to clamp said substrate extending within said substrate receiving slot and a lower plate open position, in which said lower plate is lowered, releasing said substrate to move between said upper and lower plates.

12. The apparatus of claim 11:

wherein said plate mounting means additionally includes upper plate moving means for moving said upper plate between an upper plate closed position, in which said upper plate is held downward to clamp said substrate extending within said substrate receiving slot, and an upper plate closed position, in which said upper plate is raised, releasing said substrate to move between said upper and lower plates;

wherein said upper plate moves from said upper plate closed position to said upper plate open position as said lower plate moves from said lower plate closed position to said lower plate open position; and wherein said upper plate moves from said upper plate open position to said upper plate closed position as said lower plate moves from said lower plate open position to said lower plate closed position.

13. The apparatus of claim 12, wherein said lower plate moving means includes:

a rotatably mounted shaft extending along each longitudinally-extending edge of said lower plate;

two lower plate moving cams fastened in a spaced-apart relationship to each said shaft to turn therewith, wherein a surface each said lower plate moving cam has a low point, at which said surface is closest to said shaft, and a high point, at which said surface is farthest from said shaft, said high point being diametrically opposite said low point, said low points of said lower plate moving cams being angularly aligned along each said shaft;

four lower plate cam followers fastened to said lower plate in a spaced-apart relationship, each said lower plate cam follower engaging a said lower plate moving cam to be moved thereby;

means to turn said shafts together, through a half-revolution, between a first shaft angular position, in which said lower plate is held in said closed position, and a second shaft angular position, in which said lower plate is held in said open position; and lower plate guide means for restraining said lower plate to follow a defined path into and out of contact with said substrate extending between said upper and lower plates.

14. The apparatus of claim 13, wherein said plate mounting means includes in addition:

two upper plate moving cams fastened in a spaced-apart relationship to each said shaft to turn therewith, wherein a surface each said upper plate moving cam has a low point, at which said surface is closest to said shaft, and a high point, at which said surface is farthest from said shaft, said high point being diametrically opposite said low point, said low points of said upper plate moving cams being angularly aligned along each said shaft, said low points of said upper plate moving cams being diametrically opposite said low points of said lower plate moving cams on each said shaft;

four upper plate cam followers fastened to said upper plate in a spaced-apart relationship, each said upper plate cam follower engaging a said upper plate moving cam to be moved thereby; and upper plate guide means for restraining said upper plate to follow a path into and out of contact with said substrate extending between said upper and lower plates.

15. The apparatus of claim 11, wherein said lower plate moving means includes:

a rotatably mounted shaft extending along each longitudinally-extending edge of said lower plate, two lower plate moving cams fastened in a spaced-apart relationship to each said shaft to turn therewith, each said lower plate moving cam having a cylindrical outer surface in an eccentric relationship with said shaft, said outer surfaces of said lower plate moving cams being coaxial;

four lower plate moving blocks attached to said lower plate in a spaced-apart relationship, each said lower plate moving block having a cylindrical aperture in which an outer surface of a said lower plate moving cam turns;

means to turn said shafts together, through a half-revolution, between a first shaft angular position, in which said lower plate is held in said closed position, and a second shaft angular position, in which said lower plate is held in said open position.

16. The apparatus of claim 15, wherein said plate mounting means includes in addition:

two upper plate moving cams fastened in a spaced-apart relationship to each said shaft to turn therewith, each said upper plate moving cam having a cylindrical outer surface in an eccentric relationship with said shaft, said outer surfaces of said upper plate moving cams being coaxial, wherein an axis of said outer surfaces of said upper plate moving cams extends along each said shaft diametrically opposite to an axis of said outer surfaces of said lower plate moving cams; and four upper plate moving blocks attached to said upper plate in a spaced-apart relationship, each said upper plate moving block having a cylindrical aperture in which an outer surface of said upper plate moving cam turns.

17. The apparatus of claim 10:

wherein upper segments within a first plurality of said upper segments have widths between transversely-extending, straight, parallel edges thereof equal to a first common width;

wherein a certain said upper segment has a width between transversely-extending, straight, parallel edges thereof which is substantially different from said first common width;

wherein lower segments within a second plurality of said lower segments have a width between said parallel edges extend transversely across said substrate receiving slot having a width in said longitudinal direction equal to said first common width; and wherein a certain said lower segment has a width between said parallel edges which is substantially different from said first common width.

18. The apparatus of claim 10, wherein a second plurality of said transversely-extending, straight, parallel edges of said upper segments and a third plurality of said transversely-extending, straight, parallel edges of said lower segments extend across said substrate receiving slot at a first common oblique angle.

19. The apparatus of claim 18:

wherein said upper plate additionally includes an upper aperture having a first straight edge extending transversely at a second oblique angle, substantially different from said common oblique angle; and wherein said lower plate additionally includes a lower segment having a second straight edge extending transversely adjacent said first straight edge at said second oblique angle.

20. The apparatus of claim 10:

wherein said upper plate includes a conductive upper layer and an insulating lower layer; and wherein said lower plate includes a conductive lower layer and an insulating upper layer.

21. The apparatus of claim 20:

wherein said conductive upper and lower layers are composed of a metal 0.013 inch thick; and wherein said insulating upper and lower layers are composed of a thermoplastic material 0.002 inch thick.

\* \* \* \* \*